(12) United States Patent
Blank

(10) Patent No.: US 11,270,948 B2
(45) Date of Patent: Mar. 8, 2022

(54) SEMICONDUCTOR WAFER, SEMICONDUCTOR CHIP AND METHOD OF FABRICATING A SEMICONDUCTOR WAFER

(71) Applicant: Infineon Technologies Austria AG, Villach (AT)

(72) Inventor: Oliver Blank, Villach (AT)

(73) Assignee: Infineon Technologies Austria AG, Villach (AT)

( * ) Notice: Subject to any disclaimer, the term of this patent is extended or adjusted under 35 U.S.C. 154(b) by 164 days.

(21) Appl. No.: 16/385,233

(22) Filed: Apr. 16, 2019

(65) Prior Publication Data

US 2019/0318995 A1  Oct. 17, 2019

(30) Foreign Application Priority Data

Apr. 17, 2018 (EP) .................................... 18167785

(51) Int. Cl.
*H01L 23/544* (2006.01)
*H01L 21/78* (2006.01)

(52) U.S. Cl.
CPC ............ *H01L 23/544* (2013.01); *H01L 21/78* (2013.01); *H01L 2223/5446* (2013.01)

(58) Field of Classification Search
CPC ............................. H01L 23/544; H01L 21/78; H01L 2223/5446
See application file for complete search history.

(56) References Cited

U.S. PATENT DOCUMENTS

| | | | | |
|---|---|---|---|---|
| 6,339,257 B1* | 1/2002 | Fujiki | ..................... | H01L 24/05 257/751 |
| 6,531,387 B1* | 3/2003 | Wu | ..................... | H01L 21/7684 257/E21.583 |
| 6,902,942 B2* | 6/2005 | Wu | ......................... | H01L 22/34 257/302 |
| 2003/0183949 A1* | 10/2003 | Hu | .................... | H01L 21/76856 257/784 |
| 2006/0157702 A1 | 7/2006 | Sukman-Prahofer et al. | | |
| 2009/0127553 A1* | 5/2009 | Marie | ..................... | H01L 22/34 257/48 |
| 2009/0140244 A1* | 6/2009 | Lehr | ....................... | H01L 24/13 257/48 |
| 2010/0045325 A1* | 2/2010 | Doong | .................... | H01L 22/34 324/756.03 |
| 2013/0299947 A1* | 11/2013 | Uehling | .................. | H01L 22/20 257/620 |
| 2014/0077320 A1 | 3/2014 | Chen et al. | | |
| 2015/0021733 A1* | 1/2015 | Nakamura | ............ | H01L 23/585 257/491 |
| 2015/0064877 A1 | 3/2015 | Fischer et al. | | |
| 2016/0372538 A1 | 12/2016 | Jin et al. | | |
| 2018/0261658 A1* | 9/2018 | Cok | ....................... | G01R 31/28 |

* cited by examiner

Primary Examiner — Latanya N Crawford Eason
(74) Attorney, Agent, or Firm — Murphy, Bilak & Homiller, PLLC

(57) ABSTRACT

In an embodiment, a semiconductor wafer is provided that includes a plurality of component positions with scribe line regions located at least one of adjacent to and between the component positions. The component positions include an active device structure. An auxiliary structure is positioned in one or more of the scribe line regions. The auxiliary structure is electrically coupled to an auxiliary contact pad which includes tungsten.

16 Claims, 4 Drawing Sheets

SEMICONDUCTOR WAFER, SEMICONDUCTOR CHIP AND METHOD OF FABRICATING A SEMICONDUCTOR WAFER

BACKGROUND

In various semiconductor manufacturing processes, semiconductor wafers are separated into individual chips. This separation process may also be known as dicing or singulating. The separation processes commonly occurs in kerf regions positioned between component positions. The kerf regions may contain various auxiliary structures such as, for example, process control monitor (PCM) structures, lithographic structures, alignment structures, metal pads, contacts etc. Separating the semiconductor wafer by cutting or sawing along the kerf regions also results in cutting or sawing through the auxiliary structures positioned in the kerf regions. This can cause undesirable effects such as sidewall chipping, dicing tool abrasive wear etc.

US 2015/0064877 A1 discloses a method which seeks to avoid these undesirable effects in which an auxiliary structure in a kerf region is removed and, afterwards, the semiconductor wafer separated along the kerf region. However, further improvements would be desirable.

SUMMARY

In an embodiment, a semiconductor wafer is provided that comprises a plurality of component positions with scribe line regions located at least one of adjacent to and between the component positions. The component positions comprise an active device structure. At least one auxiliary structure is positioned in one or more of the scribe line regions. The auxiliary structure is electrically coupled to an auxiliary contact pad comprising tungsten.

In some embodiments, the auxiliary contact pad comprises tungsten and has an exposed tungsten surface. The outermost surface of the auxiliary contact pad is, therefore, formed by tungsten metal and is uncovered by further materials to provide a contact surface. The auxiliary contact pad may have a thickness of 50 nm to 1000 nm and may be positioned in the scribe line region.

In some embodiments, the auxiliary contact pad is substantially coplanar with a first conductive layer of a metallization structure that is positioned on, and electrically coupled with, the active device structure in the component positions. The metallization structure may further comprise a second conductive layer comprising that is positioned in the component positions, the scribe line regions being free of the second conductive layer. The total thickness of the auxiliary contact pad is less than the total thickness of the metallization structure in the component positions.

In some embodiments, the auxiliary structure and the active device structure each comprise a transistor device structure, the transistor device structure comprising a cell region that is laterally surrounded by an edge termination region. The cell region may comprise a semiconductor layer comprising a first conductivity type forming a drift region, a body region comprising a second conductivity type that opposes the first conductivity type on the drift region, a source region comprising the first conductivity type on the body region, a plurality of trenches, each trench comprising at least one of a field plate and a gate electrode.

In some embodiments, the plurality of trenches comprises a plurality of columnar trenches, each columnar trench comprising a field plate and a plurality of elongated trenches, each elongated trench comprising a gate electrode.

The transistor device structure may further comprise one or more insulation layers arranged on the elongated trenches and on the source region and a tungsten plug extending through the one or more insulation layers and arranged on the field plate. The first conductive layer is arranged on the tungsten plug and is electrically coupled to the source region and body region.

In an embodiment, a method of fabricating a semiconductor wafer comprises providing a semiconductor wafer, forming active device structures in component positions with scribe line regions located at least one of adjacent to and between the component positions, forming one or more auxiliary structures in one or more of the scribe line regions, forming a metallization structure on the component positions and on the scribe line regions, wherein a first conductive layer of the metallization structure comprises tungsten and forming one or more auxiliary contact pads in the tungsten layer arranged in the scribe line regions that are electrically coupled to one or more of the auxiliary structures. The auxiliary tungsten pads may comprise an outermost surface formed of tungsten metal that is uncovered or exposed.

In some embodiments, the method may further comprises forming a second conductive layer of the metallization structure. The second conductive layer is positioned on the component positions and leaves the one or more auxiliary contact pads in the scribe lines exposed. The second conductive layer is tungsten free. The second conductive layer may comprise aluminum and/or copper.

In some embodiments, forming the auxiliary structure and/or forming the active device structure comprises forming a body region comprising a second conductivity type that opposes the first conductivity type in a semiconductor layer comprising a first conductivity type forming a drift region, forming a source region comprising the first conductivity type on the body region, forming a plurality of columnar trenches, forming a field plate in each columnar trench, forming an elongated trench in regions of the semiconductor layer between the columnar trenches, forming a gate electrode in the elongated trench, forming one or more insulation layers arranged on the columnar trenches, the elongated trench and on the source region, forming an opening in the one or more insulation layers above the field plate, and inserting tungsten into the opening and onto the field plate. The first conductive layer is formed on the tungsten in the opening and electrically couples the first conductive layer to the source region and body region.

In some embodiments, the method further comprises applying an external contact to the auxiliary contact pad and measuring one or more parameters of the auxiliary structure.

In some embodiments, the method further comprises singulating the wafer by cutting along the scribe line regions and through the auxiliary structure and the auxiliary contact pad.

In an embodiment, a semiconductor chip comprises a semiconductor substrate comprising an active device region and a peripheral edge region laterally surrounding the active device region. A discrete region of a layer comprises tungsten is arranged in the peripheral edge region. The discrete region may include tungsten metal and have an outermost surface formed from tungsten.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier or semiconductor wafer. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier or semiconductor wafer.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
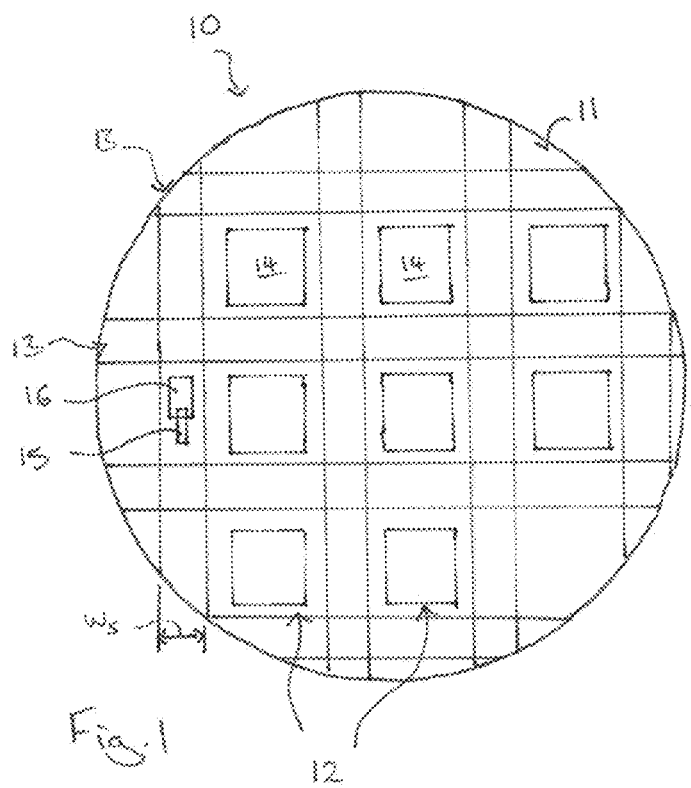
FIG. 1 illustrates a schematic plan view of a top side of a semiconductor wafer.
Figure 2:
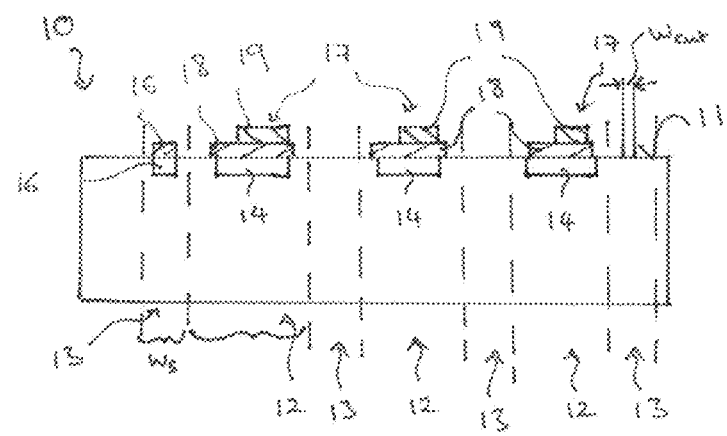
FIG. 2 illustrates a schematic cross-sectional view of the semiconductor wafer of FIG. 1.

FIG. 1 illustrates a schematic plan view and FIG. 2 a cross-sectional view of a semiconductor wafer 10.

FIG. 1 illustrates a top side 11 of the semiconductor wafer 10. The semiconductor wafer 10 includes a plurality of component positions 12 with scribe line regions 13 located at least one of adjacent and between the component positions 12. Each component position 12 is surrounded on all lateral sides by a scribe line region 13. The component positions 12 include an active device structure 14. At least one auxiliary structure 15 is positioned in one or more of the scribe line regions 13. The auxiliary structure 15 is electrically coupled to an auxiliary contact pad 16 which comprises tungsten.

The component positions 12 are typically arranged in rows and columns and are separated from their nearest neighbour by scribe line regions 13. The scribe line regions 13 may also be called a separation region or a saw street. A scribe line region 13 is positioned adjacent the outermost component positions 12 so that each component position 12 is bounded on all lateral sides by a scribe line region 13. The scribe line regions 13 typically form a regular grid structure. To separate the semiconductor wafer 10 into individual chips, the wafer 10 is cut along the scribe line regions 13.

The scribe line regions 13 have a width $w_s$ which is typically slightly larger than the width of the material that is removed by the separation process, e.g., $w_{cut}$. The width $w_s$ of the scribe line regions 13 may lie in the region of 40 μm to 120 μm or 60 μm to 90 μm. The region of the scribe line region 13 which is cut and removed to separate the chips from the wafer is called the kerf region. The kerf region has a width $w_{cut}$ which is less than the width $w_s$ of the scribe line region 13.

The semiconductor wafer 10 is separated along the scribe line regions 13 to produce semiconductor chips from the component positions 12 that include the active device structure 14. Typically, each component position 12 of the semiconductor wafer includes an active device structure 14 and may include the same active device structure. However, in some embodiments, the active device structure in one or more of the component positions 12 may differ from that active device structure of one or more further component positions 12.

The semiconductor wafer 10 may comprise a single crystal silicon wafer which may comprise an epitaxially deposited silicon layer, commonly known as an epi layer.

The auxiliary structure 15 in the scribe line region 13 is a structure formed during the processing of a semiconductor wafer which does not interact with or affect the active device structures 14 in the component positions 12 of the processed semiconductor wafer 10. The auxiliary structure 15 may be used to evaluate the manufacturing process of a semiconductor device such as the active device structures 14 in the component positions 12. Examples of auxiliary structures 15 include, for example, process control monitor (PCM) devices, for example electric PCM devices, lithographic structures, metal pads, contacts for electrochemical etching, and alignment structures. The wafer 10 may also include auxiliary structures of different types for different purposes.

In some embodiments, at least one auxiliary structure 15 has the same structure as the active device structure 14. For example the auxiliary structure 15 and the active device structure 14 may be a transistor device structure. The auxiliary structure 15 may be a laterally smaller version of the active device structure 14.

In some embodiments, at least one auxiliary structure 15 may include a structure for measuring one or more parameters of one or more features of the transistor device structure without the auxiliary structure 15 itself having a transistor device structure or a transistor device structure replicating the active transistor device structure 14. For example, an auxiliary structure 15 may be without trenches and be used for measuring the sheet resistance of the source and body region of the active transistor device structure in the component positions or the auxiliary structure 15 may include a trench filled with polysilicon and be used for measuring the resistance of the polysilicon in the trench.

Two or more auxiliary contact pads 16 may be coupled to a single auxiliary structure. The auxiliary contact pad 16 comprises tungsten and may be positioned in the scribe line region 13. The auxiliary contact pad 16 may be formed from tungsten metal. In some embodiments, the auxiliary contact pad 16 comprises an exposed tungsten surface. At least a portion of the outermost surface of the auxiliary pad 16 is, therefore, formed by tungsten and is uncovered by further material including metallic layers. This exposed tungsten surface provides a free-lying contact surface.

In some embodiments, the auxiliary contact pad 16 has a multilayer structure, whereby tungsten, which in some embodiments is pure tungsten metal, forms the outermost sublayer of the multilayer structure of the auxiliary contact pad 16. Underlying sublayers of the multilayer structure may include a Ti/TiN structure for improving adhesion.

The auxiliary contact pad 16 may have a thickness of 50 nm to 1000 nm. The auxiliary contact pad 16 may be formed from a conductive layer comprising tungsten that is positioned on the scribe line region 13. The scribe line region 13 may include further portions of this conductive layer in addition to the auxiliary contact pad 16 or pads that are coupled to the auxiliary structure 15.

In some embodiments, the active device structure 14 is a transistor device structure. The active device structure 14 may also include a metallisation structure 17 arranged on the top surface 11 of the semiconductor wafer 10 in at least the component positions 12, as can be seen in the cross-sectional view of FIG. 2.

The metallisation structure 17 arranged in the component positions 12 is positioned on, and electrically coupled with, the active device structure 14, in that component position 12. The metallisation structure 17 in the component position 12 may have a greater thickness than the thickness of the auxiliary contact pad 16 and any other conductive layer or layers arranged in the scribe line region 13. For example, the metallization layer may have a thickness that is at least 5 times greater or at least 10 times greater than the thickness of the auxiliary contact pad 16. The metallisation structure 17 may have a thickness of around 5 μm, for example.

The reduced thickness of the auxiliary contact pad 16 and further conductive layer, if present, in the scribe line region 13 may assist in reducing defects or defective chips, such as reducing undesirable chipping of the top side, side walls and/or rear surface of the semiconductor material during separation of the semiconductor chips from the semiconductor wafer 10 by the cutting action along the scribe line regions 13 and through the auxiliary contact pad 16 and/or through the auxiliary structure 15. The reduced thickness of the tungsten auxiliary contact pad 16 and further conductive layer, if present, in the scribe line region 13 may assist in increasing the yield. Since the semiconductor wafer 10 is cut through the auxiliary structures 15, an increase in the width $w_s$ of the scribe line region 13 to enable a cut to be formed laterally adjacent the auxiliary structure 15 is avoided. Furthermore, additional processing to remove auxiliary structures and or auxiliary pads from the scribe line region before separating the semiconductor wafer into chips can be avoided.

The metallisation structure 17 may include a first conductive layer 18 arranged on the top surface 11 of the semiconductor wafer 10 and a second conductive layer 19 arranged on the first layer 18. In some non-illustrated embodiments, an insulation layer may be arranged between the first conductive layer 18 and the second conductive layer 19 and at least portions of the two conductive layers 18, 19 may be electrically connected by vias extending through the intervening insulation layers. The first conductive layer 18 and the second conductive layer 19 are commonly structured to provide a redistribution structure. The redistribution structure may provide two or more conductive redistribution paths that are electrically insulated from one another. For example, for a transistor device structure, a redistribution structure may be provided in the component position 12 for each of the source, drain and gate of the transistor device.

The first conductive layer 18 may comprise tungsten and may be substantially coplanar with the auxiliary contact pad 16 which is coupled to the auxiliary structure 15 arranged in the scribe line region 13. In some embodiments, the thickness of the auxiliary contact pad 16 and the first conductive layer 18 is substantially the same. The first conductive layer 18 of the metallization structure 17 may have a thickness of 100 nm to 900 nm. The second conductive layer 19 may have a thickness of around 5 μm.

The first conductive layer 18 comprises tungsten and, in some embodiments, the second conductive layer 19 comprises a metal or layer or alloy which is tungsten free. In some embodiments, the second conductive layer 19 comprises aluminum and/or copper. The second conductive layer 19 may also include two or more sublayers and may comprise stacks of metals and/or alloys. For example, the second conductive layer 19 may be a nickel-based metallization, such as the nickel-based NiV, NiP, NiMoP, NiPPd and NiPPd systems, or a Au-based metallization or a silver-based metallization such as a Ti/NiV/Ag stack.

The auxiliary contact pad 16 can be formed using the same processes as the first conductive layer 18. This may be useful if, for example, the first conductive layer 18 forms part of the metallization layer 17 for the active device structures 14. A first conductive layer may be deposited onto both the components positions 12 and the scribe line regions 13 of the semiconductor wafer 10 and patterned to from the auxiliary contact pad 16 in the scribe line region 13 and the first conductive layer 18 of the redistribution structure 17 in the component positions 12.

After patterning of the first conductive layer 18 to form the layer of metallization layer 17 in the component positions 12 and the conductive layer and/or auxiliary contact pad 16 in the scribe line regions 13, the scribe line regions 13 may be covered during the subsequent build up of the metallization structure 17 in the component positions 12, for example during formation of the second conductive layer 18.

In some embodiments, the metallization structure 17 includes more than two conductive layers. The lowermost conductive layer of the three or more conductive layers of such a metallization structure 17 may comprise tungsten and be coplanar with the auxiliary contact pad 16.

In some embodiments, the auxiliary structure 15 and the active device structure 14 each comprise a transistor device structure. The auxiliary structure 15 and the active device structure 14 each comprise the same transistor device structure. The transistor device structure may include a cell region that is laterally surrounded by an edge termination region. The transistor device structure may be a field effect transistor device structure, for example a MOSFET device structure, such as a superjunction MOSFET using a charge compensation principle.

The lateral size of the transistor device may be smaller for the auxiliary structure 15 than for the active device structure 14 whilst having the same transistor device structure. For example the cell region of the auxiliary structure 15 may comprise fewer cells than the cell region of the active device structure 14.

Figure 3:
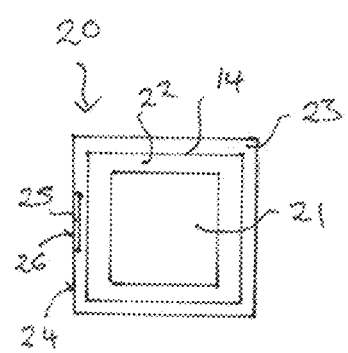
FIG. 3 illustrates a top view of a semiconductor chip separated from the semiconductor wafer of FIGS. 1 and 2.

FIG. 3 illustrates a plan view of a semiconductor chip 20 which has been singulated from the wafer 10 by dicing or sawing along scribe line regions 13. The semiconductor chip 20 is formed from a component position 12 and includes an active device structure 14. The active device structure 14 includes a cell field 21 that is laterally surrounded by an edge termination region 22. The edge termination region 22 is in turn laterally surrounded by a peripheral edge region 23 which extends to the side faces 24 of the semiconductor chip 20. The peripheral edge region 23 is formed from a remaining portion of the scribe line region 13. The semiconductor chip 20 includes a discrete region 25 comprising a layer of tungsten in the peripheral edge region 23. The side face 26 of the discrete region 25 may form a portion of the side face 24 of the semiconductor chip 40. The discrete region 25 comprising a layer of tungsten may be a remaining portion of the auxiliary contact pad 16 which is formed in the scribe line regions 13. The peripheral edge region 23 may also include a remaining portion or all of the auxiliary structure 15.

To separate the semiconductor wafer 10 into individual semiconductor chips, a portion of the scribe line region 13 is removed, for example by mechanical sawing or laser cutting through the thickness of the semiconductor wafer. The saw or cut that is inserted into the scribe line region 13 has a width, $w_{cut}$, which is less than the width $w_s$ of the scribe line regions 13. Consequently, the most peripheral regions of the semiconductor chips 20 are formed by a portion of the scribe line region 13 that is not removed by the separating action and that is positioned immediately adjacent the edge termination region 22 of the active device structure 14. Portions of the auxiliary structure 15 and/or auxiliary pad 16 positioned on this remaining portion of the scribe line region may be discernable at the peripheral edge region 23 of the separated semiconductor chip 20.

As discussed above, in some embodiments, the auxiliary structure 15 and the active device structure 14 each comprise a transistor device structure.

Figure 4:
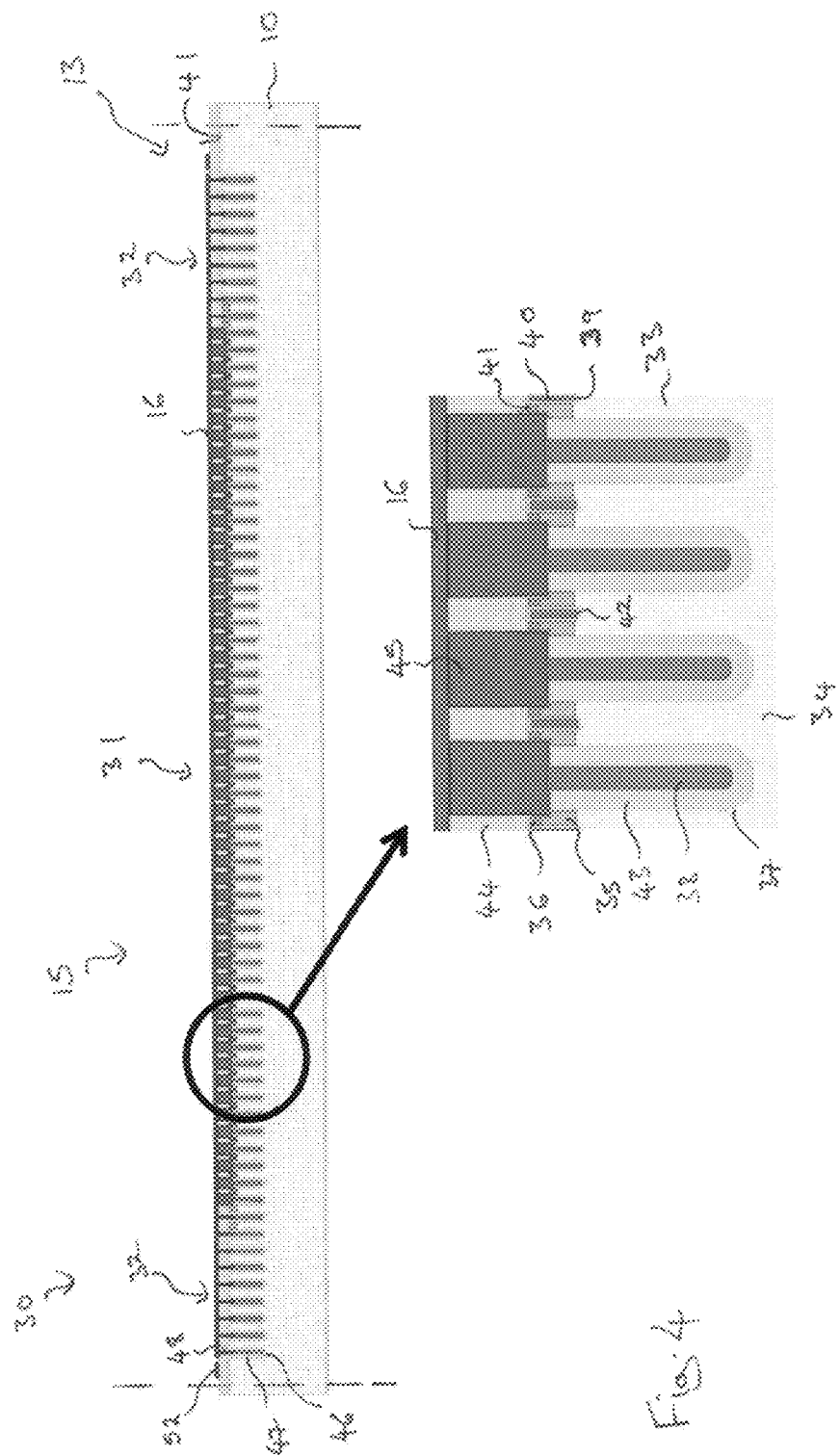
FIG. 4 illustrates a cross-sectional view of an auxiliary structure positioned in a scribe line region of a semiconductor wafer.

FIG. 4 illustrates a cross-sectional view of a transistor device structure 30. The transistor device structure 30 includes a cell region or cell field 31 that is laterally surrounded by an edge termination region 32. The insert of FIG. 4 illustrates an enlarged view of a portion of the cell region 31. The transistor device structure 30 may be a field effect transistor device structure.

The transistor device structure 30 is, in the illustrated embodiment, an auxiliary structure 15 which is positioned in a scribe line 13 of the semiconductor wafer 10. However, the active device structure 14 and the component position 12 may also comprise this transistor device structure 30 so that FIG. 4 may equally refer to the active device structure 14 in the component position 12 illustrated in FIGS. 1 to 3.

The transistor structure 30 forming the auxiliary structure 15 is commonly a laterally smaller version of the transistor structure of the active device structure 14 in the component position 12 and includes not only the cell region 31, but also the edge termination region 32. The number of cells in the cell region 31 of the auxiliary structure 15 is, however, less than the number of cells in the cell region of the active device structure 14. The smaller lateral size of the transistor structure 30 of the auxiliary structure 15 may be useful for process monitoring purposes since the smaller lateral area results in a higher on-resistance which can be more easily and accurately measured. Further properties of the transistor structure which may be measured on the auxiliary structure 15 include breakdown voltage.

In some embodiments, the cell region 31 comprises a semiconductor layer 33, which may be formed by the material of the semiconductor wafer 10, for example silicon, or an epitaxial layer of silicon formed on a single crystal silicon wafer. The semiconductor layer 33 comprises a first conductivity type and forms the drift region 34. The cell region 31 further includes a body region 35 comprising a second conductivity type, that opposes the first conductivity type, the body region 35 being arranged on the drift region 34, and a source region 36 comprising the first conductivity type arranged on the body region 35. The first conductivity type may be n-type and the second conductivity type p-type, or vice versa. The transistor structure 30 further includes a plurality of trenches 37 extending into the semiconductor layer 33 from the first surface 41.

In some embodiments, such as that illustrated in FIG. 4, a first plurality of trenches 37 are provided that have a columnar form and each comprise a field plate 38. In this embodiment, the cell region 31 further comprises a second plurality of trenches 39 that are elongate or strip-like, each elongated trench 39 comprising a gate electrode 40. The elongated trenches 39 may extend substantially parallel to one another into the plane of the drawing. Elongated trenches 39 are alternately arranged with a row of discrete columnar trenches 37, whereby the rows extend into the plane of the drawing and substantially parallel to the elongated trenches 39.

The body region 35 and source regions 36 extend between the columnar trenches 37 and the elongated trenches 39 including the gate electrode 40 extend into the semiconductor wafer 33 from the top surface 41 through the source region 36 and body region 35. The elongated trenches 39 are lined with an insulation layer 42, forming a gate insulation or gate oxide. The base of the elongated trenches 39 may extend into the top of the drift region 34. The columnar trenches 37 extend to a greater depth from the first surface 41 of the semiconductor wafer 10 into the body of the semiconductor layer 33. The columnar trenches 37 also lined with an insulating layer 43 which insulates the field plate 38 from the drift region 34.

The transistor device structure 30 further comprises one or more insulation layers 44 which are arranged on the first surface 41 of the semiconductor wafer 10 and on the elongated trenches 39 including the gate electrodes 40 and on the source regions 36. The insulation layer 44 or uppermost insulation layer, if two or more insulation layers are provided may be BPSG (borophosphosilicate glass). The first conductive layer 18 or auxiliary contact pad 16 is arranged on the insulation layer 44.

The transistor device structure 30 further comprises vertical metal contacts 45, which may comprise tungsten and have the form of a tungsten plug. Each tungsten plug 45 extends through the one or more insulation layers 44 and is arranged on a field plate 38 in one of the columnar trenches 37. The first conductive layer 18 or auxiliary contact pad 16 is arranged on the insulating layers 44 and on the tungsten plug 45 and is electrically coupled to the field plates 38, source region 36 and the body region 35.

The edge termination region 32 also includes columnar trenches 46 comprising a field plate 47. The field plates 47 are electrically coupled to the first conductive layer 18 by tungsten plugs 48 as in the cell region 31. The edge termination region 32 is, however, free of source region and elongated trenches comprising the gate electrode so that the semiconductor layer 33 extends to the upper surface 41 and is in direct contact with the insulating layer or layers 44. The body region may be positioned in some portions of the edge termination region 32.

In some embodiments, a barrier is positioned underneath the tungsten material of the auxiliary contact pad 16, the first conductive layer 18 and the tungsten plug 45. A Ti/TiN barrier may be deposited first and the tungsten of the auxiliary contact pad 16, the first conductive layer 18 or the tungsten plug 45 deposited on top. The Ti layer may have a thickness of around 30 nm and the TiN layer a thickness of around 40 nm. The tungsten may be deposited using Chemical Vapour Deposition (CVD). The Ti and TiN barrier may be deposited using Physical Vapour Deposition (PVD) for example sputtering, Chemical Vapour Deposition (CVD) or Atomic Layer Deposition (ALD).

The transistor device structure 31 is, however, not limited to this particular structure any may have other structures. For example in some embodiments, each of the trenches comprising a field plate is elongate. In some embodiments, each of the trenches comprises a field plate and a gate electrode arranged on and electrically isolated from the field plate. In some embodiments, each of the trenches is elongate and the plurality of trenches form a series of stripes bordering strip-like mesas in which the drift region, body region and source region are arranged.

Figure 5:
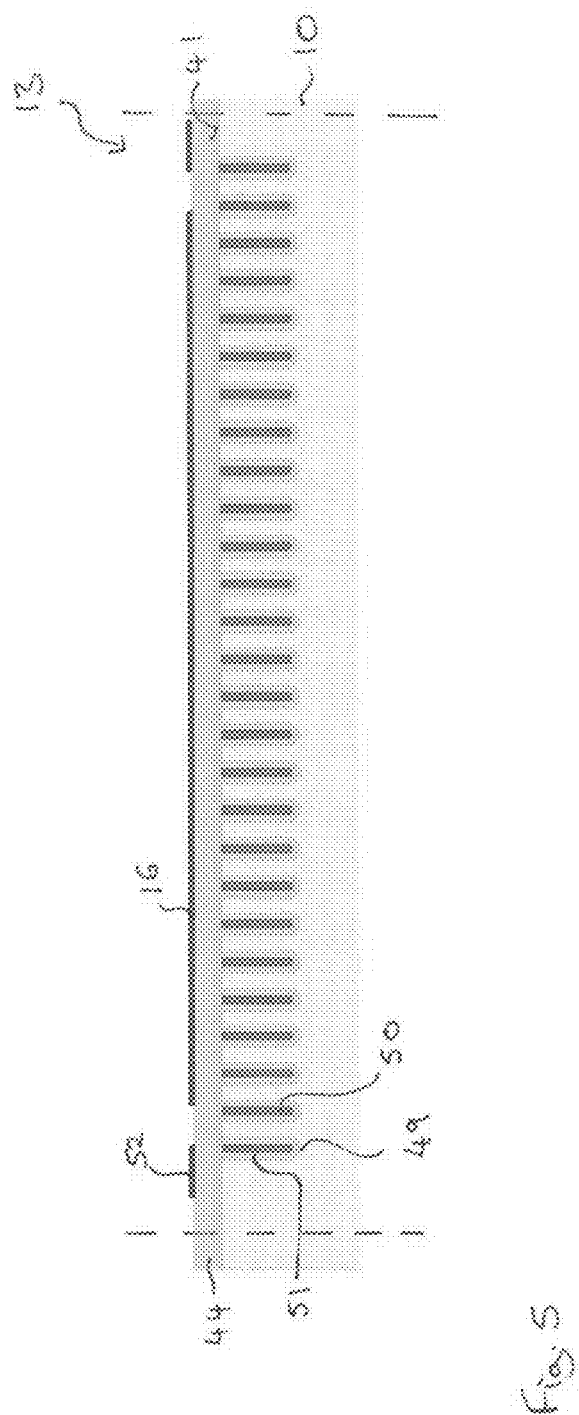
FIG. 5 illustrates a cross-sectional view of a scribe line region including trenches.

In some embodiments, the scribe line region 13 includes further structures which are not part of the auxiliary structure 15 or active device structure 14. FIG. 5 illustrates a view of such a position. At this position of the scribe line region 13, further trenches, in particular columnar trenches 49 including field plates 50 are arranged in the scribe line regions 13 and, therefore, at positions adjacent the transistor structure 30 of auxiliary structure 15. The columnar trenches 49 are lined with an insulation layer 51 that electrically insulates the field plates 50 from the semiconductor layer 33.

The columnar trenches 49 and the field plates 50 are covered by the insulation layer or layers 44 and that the auxiliary contact pad 16 or further conductive layer 52 that comprises tungsten is arranged on the insulation layer 44. These field plates 50 are not coupled to the auxiliary contact pad 16 or further conductive layer and may be considered as fill trenches or dummy trenches. These fill trenches or dummy trenches may be used to adjust the open area by etching of the trenches so that it is substantially equal to a predetermined value. This assists in achieving the desired etching properties when using etching conditions optimised for the predetermined open area. The fill or dummy trenches my also assist to uniformly distribute mechanical stress across the semiconductor wafer 10.

Figure 6:
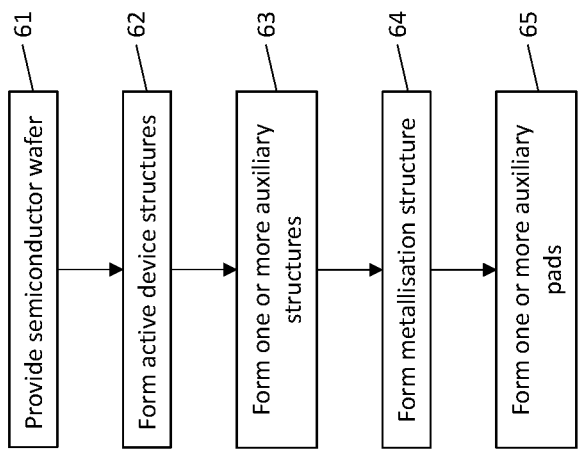
FIG. 6 illustrates a flowchart of a method for of fabricating a semiconductor wafer.

FIG. 6 illustrates a flowchart 60 of a method for fabricating a semiconductor wafer.

In block 61, a semiconductor wafer is provided. In block 62, active device structures are formed in component positions with scribe line regions located at least one of adjacent to and between the component positions. In block 63, one or more auxiliary structures are formed in one or more of the scribe line regions. In block 64, a metallisation structure is formed on the component positions and on the scribe line regions. The first conductive layer of the metallisation structure comprises tungsten. In block 65, one or more auxiliary pads are formed in the tungsten layer arranged in the scribe line regions, the one or more pads being electrically coupled to one or more of the auxiliary structures.

In a further optional method, a second conductive layer of the metallisation structure is formed which is positioned on the component positions and leaves the one or more auxiliary contact pads in the scribe line regions exposed. The second conductive layer may comprise a different material to the first conductive layer and may be free of tungsten. The second conductive layer may comprise aluminum and/or copper, or a nickel-based metallization, such as the nickel-based NiV, NiP, NiMoP, NiPPd and NiPPd systems, or a Au-based metallization or a silver-based metallization such as a Ti/NiV/Ag stack.

The total thickness of the conductive layers in the component positions may be greater than the thickness of the auxiliary contact pads in the scribe line regions. For example, the tungsten layer and, therefore, the auxiliary contact pads may have a thickness of 100 nm to 900 nm. The second conductive layer may have a thickness that is at least 5 times or 10 times greater than the thickness of the first conductive layer and of the auxiliary contact pad. The second conductive layer may have a thickness of around 5 µm.

In some embodiments, the method further comprises forming a transistor device structure in the scribe line region and in the component position. The transistor device region may include a cell region or cell field that is laterally surrounded by an edge termination region. In some embodiments, in the cell region, the method comprises forming a body region comprising a second conductivity type in a semiconductor layer comprising a first conductivity type that forms a drift region, forming a source region comprising the first conductivity type on the body region and forming a plurality of trenches. The second conductivity type opposes the first conductivity type. The semiconductor wafer may comprise a single crystal silicon wafer which may comprise an epitaxially deposited silicon layer, commonly known as an epi layer, which provides the drift region.

The trenches may be formed in the first surface of the semiconductor wafer and extend through the source region, body region and into the drift region.

In some embodiments, the trenches may have different lateral shapes. In some embodiments, the method further comprises forming a plurality of columnar trenches, forming a field plate in each columnar trench, and forming a plurality of elongated trenches, whereby an elongated trench in regions of the semiconductor layer between the columnar trenches, and forming a gate electrode in the elongated trenches. The method may further comprise forming one or more insulation layers on the first surface, forming an opening in the one or more insulation layers above the field plate and inserting tungsten into the opening and onto the field plate. The first conductive layer is formed on the tungsten in the opening to electrically couple the first conductive layer to the field plate, source region and body region.

In some embodiments, the tungsten filling the opening and the first conductive layer that comprises tungsten are formed in a single process, for example a single deposition process. In some embodiments, the opening is filled with tungsten in a first deposition process and the first conductive layer is deposited in a second deposition process. In some embodiments, an interface is discernible between the tungsten in the opening and the first conductive layer that is indicative of the use of two deposition processes.

After fabrication of the wafer, the method may further comprise applying an external contact to the auxiliary contact pad and measuring one or more parameters of the auxiliary structure.

In some embodiments, the method may further comprise singulating the wafer by cutting along the scribe line regions and through the auxiliary structure and the auxiliary contact pad to form a plurality of semiconductor chips from the semiconductor wafer.

The fabrication methods described herein may be used to increase the yield of semiconductor chips from the wafer that meet the desired criteria, since the occurrence of undesirable effects such as sidewall chipping, dicing tool abrasive wear and so on may be reduced due to the use of tungsten contact pads in the scribe line regions that are coupled to the auxiliary structures. These tungsten contact pads have a smaller thickness compared to the metallization structure of the active devices in the component positions and may be fabricated using the processes used to form a section, for example one conductive layer, of this metallization structure and be excluded from the processes used to form other sections of the metallization structure, for example subsequent conductive layers. If laser sawing is used to singulate the wafer into individual semiconductor chips, as the tungsten pads in the scribe line regions have a reduced thickness, the processing time may be shorter and the processing window wider. For example, the penetration depth in the dicing foil is likely to be smaller in the regions of the kerf region without the tungsten.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor wafer, comprising:
a plurality of component positions with scribe line regions located at least one of adjacent to and between the component positions, the component positions comprising an active device structure; and
an auxiliary structure positioned in one or more of the scribe line regions,
wherein the auxiliary structure is electrically coupled to an auxiliary contact pad comprising tungsten,
wherein the auxiliary contact pad has an exposed tungsten surface,
wherein the auxiliary structure and the active device structure each include a transistor device structure comprising a cell region that is laterally surrounded by an edge termination region.

2. The semiconductor wafer of claim 1, wherein the auxiliary contact pad has a thickness in a range of 50 nm to 1000 nm.

3. The semiconductor wafer of claim 1, wherein the auxiliary contact pad is positioned in a scribe line region.

4. The semiconductor wafer of claim 1, wherein the auxiliary contact pad is substantially coplanar with a first conductive layer of a metallization structure that is positioned on, and electrically coupled with, the active device structure in the component positions.

5. The semiconductor wafer of claim 4, wherein the metallization structure further comprises a second conductive layer that is positioned in the component positions, and wherein the scribe line regions are free of the second conductive layer.

6. The semiconductor wafer of claim 1, wherein the cell region comprises a semiconductor layer of a first conductivity type forming a drift region, a body region of a second conductivity type that opposes the first conductivity type on the drift region, a source region of the first conductivity type on the body region, and a plurality of trenches, each trench comprising at least one of a field plate and a gate electrode.

7. The semiconductor wafer of claim 6, wherein the plurality trenches comprises a plurality of columnar trenches, each columnar trench comprising a field plate and a plurality of elongated trenches, each elongated trench comprising a gate electrode.

8. The semiconductor wafer of claim 7, wherein the transistor device structure further comprises one or more insulation layers arranged on the elongated trenches and on the source region, and a tungsten plug extending through the one or more insulation layers and arranged on the field plate, and wherein a first conductive layer of a metallization structure that is positioned on, and electrically coupled with, the active device structure in the component positions is arranged on the tungsten plug and is electrically coupled to the source region and the body region.

9. A method of fabricating a semiconductor wafer, the method comprising:
providing a semiconductor wafer;
forming active device structures in component positions with scribe line regions located at least one of adjacent to and between the component positions;
forming one or more auxiliary structures in one or more of the scribe line regions;
forming a metallization structure on the component positions and on the scribe line regions, wherein a first conductive layer of the metallization structure comprises tungsten;
forming one or more auxiliary contact pads in the tungsten layer arranged in the scribe line regions and that are electrically coupled to the one or more auxiliary structures,
wherein at least one of forming the one or more auxiliary structures and forming the active device structures comprises:

forming a body region of a second conductivity type that opposes a first conductivity type in a semiconductor layer of the first conductivity type forming a drift region;

forming a source region of the first conductivity type on the body region;

forming a plurality of columnar trenches;

forming a field plate in each columnar trench;

forming an elongated trench in regions of the semiconductor layer between the columnar trenches;

forming a gate electrode in the elongated trench;

forming one or more insulation layers arranged on the columnar trenches, the elongated trench and on the source region;

forming an opening in the one or more insulation layers above the field plate; and inserting tungsten into the opening and onto the field plate, wherein the first conductive layer is formed on the tungsten in the opening to electrically couple the first conductive layer to the source region and body region.

10. The method of claim 9, further comprising:

forming a second conductive layer of the metallization structure, the second conductive layer being positioned on the component positions and leaving the one or more auxiliary contact pads in the scribe lines exposed, wherein the second conductive layer is tungsten free.

11. The method of claim 9, further comprising:

applying an external contact to the one or more auxiliary contact pads; and measuring one or more parameters of the one or more auxiliary structures.

12. The method of claim 9, further comprising:

singulating the semiconductor wafer by cutting along the scribe line regions and through the one or more auxiliary structures and the one or more auxiliary contact pads.

13. A semiconductor wafer, comprising:

a plurality of component positions with scribe line regions located at least one of adjacent to and between the component positions, the component positions comprising an active device structure;

an auxiliary structure positioned in one or more of the scribe line regions; and a metallisation structure arranged on a top surface of the semiconductor wafer, wherein the metallisation structure comprises:

a first conductive layer patterned to form an auxiliary contact pad in one or more of the scribe line regions and a first layer of a redistribution structure in the component positions; and a second conductive layer arranged on the first conductive layer in the component positions but not on the auxiliary contact pad, wherein the second conductive layer is patterned to form a second layer of the redistribution structure in the component positions, the first conductive layer and the second conductive layer being commonly structured to provide the redistribution structure, wherein the auxiliary contact pad is electrically coupled to the auxiliary structure, wherein the metallization layer has a thickness in the component positions that is at least 5 times greater than the thickness of the auxiliary contact pad.

14. The semiconductor wafer of claim 13, wherein an insulation layer is arranged between the first conductive layer and the second conductive layer, and wherein at least portions of the first conductive layer and the second conductive layer are electrically connected by vias extending through the insulation layer.

15. The semiconductor wafer of claim 13, wherein the active device structure is a transistor device structure, and wherein the redistribution structure provides source, drain and gate redistribution paths that are electrically insulated from one another.

16. The semiconductor wafer of claim 13, wherein the first conductive layer comprises tungsten, and wherein the second conductive layer comprises a metal or layer or alloy which is tungsten free.

* * * * *